(12) United States Patent
Komatsu et al.

(10) Patent No.: US 7,646,381 B2
(45) Date of Patent: Jan. 12, 2010

(54) INTEGRATED CIRCUIT DEVICE MOUNTABLE ON BOTH SIDES OF A SUBSTRATE AND ELECTRONIC APPARATUS

(75) Inventors: Fumikazu Komatsu, Okaya (JP); Naoki Ii, Suwa (JP)

(73) Assignee: Seiko Epson Corporation (JP)

( * ) Notice: Subject to any disclaimer, the term of this patent is extended or adjusted under 35 U.S.C. 154(b) by 693 days.

(21) Appl. No.: 11/462,066

(22) Filed: Aug. 3, 2006

(65) Prior Publication Data

US 2007/0055812 A1    Mar. 8, 2007

(30) Foreign Application Priority Data

Aug. 5, 2005    (JP) ............................. 2005-228082
Jul. 7, 2006    (JP) ............................. 2006-187949

(51) Int. Cl.
   *G06F 3/038*    (2006.01)
   *H03K 19/173*    (2006.01)
   *H01L 21/82*    (2006.01)

(52) U.S. Cl. .......................... 345/204; 326/38; 438/128
(58) Field of Classification Search .................... 345/87
   See application file for complete search history.

(56) References Cited

U.S. PATENT DOCUMENTS

| 7,372,298 B2 * | 5/2008 | Chu et al. ...................... 326/38 |
| 2003/0117960 A1 * | 6/2003 | Quinlan et al. .............. 370/241 |

(Continued)

FOREIGN PATENT DOCUMENTS

JP    2001-236303    8/2001

(Continued)

OTHER PUBLICATIONS

"Reduced Swing Differential Signaling RSDS Outputs", Jul. 2004, National Semiconductor, p. 17.*

*Primary Examiner*—Richard Hjerpe
*Assistant Examiner*—Dorothy Webb
(74) *Attorney, Agent, or Firm*—Harness, Dickey & Pierce, P.L.C.

(57) ABSTRACT

An integrated circuit device includes: first through fourth terminals arranged in order in which the first terminal and the fourth terminal are arranged in line symmetry with respect to a center axis of the first through fourth terminals, and the second terminal and the third terminal are arranged in line symmetry with respect to the center axis; a first receiving circuit coupled to the first and second terminals, the first receiving circuit receiving one of a first differential signal pair and a second differential signal pair; a second receiving circuit coupled to the third and fourth terminals, the second receiving circuit receiving the first differential signal pair when the first receiving circuit receives the second differential signal pair and the second differential signal pair when the first receiving circuit receives the first differential signal pair; a first selector selecting one of a first signal and a second signal obtained by inverting the first signal that are output from the first receiving circuit based on a select signal; a second selector selecting one of a third signal and a fourth signal obtained by inverting the third signal output from the second receiving circuit based on the select signal; and a third selector outputting each output of the first and second selectors by switching each output to a first output line and a second output line based on the select signal.

15 Claims, 9 Drawing Sheets

U.S. PATENT DOCUMENTS

2004/0227747 A1* 11/2004 Ishibashi et al. ............ 345/204
2005/0219235 A1* 10/2005 Fukuo ....................... 345/204

FOREIGN PATENT DOCUMENTS

| | | |
|---|---|---|
| JP | 2003-256352 | 9/2003 |
| JP | 2005-198024 | 7/2005 |
| JP | 2005198024 A * | 7/2005 |

* cited by examiner

| SELECT | OUTPUT O |
|---|---|
| 1 | A |
| 0 | B |

| SELECT | OUTPUT O | OUTPUT Q |
|---|---|---|
| 1 | A | B |
| 0 | B | A |

INTEGRATED CIRCUIT DEVICE MOUNTABLE ON BOTH SIDES OF A SUBSTRATE AND ELECTRONIC APPARATUS

The entire disclosure of Japanese Patent Application No. 2005-228082, filed Aug. 5, 2005 is expressly incorporated by reference herein.

BACKGROUND

The present invention relates to an integrated circuit device and electronic apparatus provided with an interface circuit mountable on both sides of a substrate.

An interface circuit such as a driver integrated circuit (a driver IC) with a high speed serial interface is required. For example, for a liquid crystal display apparatus, it is common to mount a driver IC on a front surface of a glass substrate on which a liquid crystal display section will be mounted. However, it is also required to mount the driver IC on a back surface of a glass substrate because of various factors such as convenience of designing an apparatus and downsizing of an apparatus.

However, because the driver IC includes various terminals, positions of the terminals invert depending on a case to mount on a front surface or a back surface. Therefore, a wiring pattern on a glass substrate has to be changed for mounting on a front surface or a back surface as well as arrangement of a circuit on a driver IC. As it especially requires change of a macrocell that incurs manual wiring and arrangement of a circuit cell, the above-mentioned requirement was hard to satisfy.

In particular, in a case of a driver IC with a built-in interface circuit receiving and/or transmitting signals by a differential signal pair, the situation becomes more complicated as two terminals for the differential signal pair are also arranged inversely depending on a case of mounting on a front or a back surface. The problem above cannot be solved with related art disclosed in JP-A-2001-236303 and JP-A-2003-256352.

SUMMARY

An advantage of the invention is to provide an integrated circuit and an electronic apparatus with an interface circuit mountable on both sides of a substrate without making a change such as a change of a macrocell.

An integrated circuit device mountable on both sides of a substrate according to a first aspect of the invention includes first through fourth terminals arranged in order, a first receiving circuit, a second receiving circuit, a first selectors a second selector, and a third selector. The first terminal and the fourth terminal are in line symmetry with respect to a center axis of the first through fourth terminals, and the second terminal and the third terminal are in line symmetry with respect to the center axis. The first receiving circuit coupled to the first and second terminals receives one of a first differential signal pair and a second differential signal pair. The second receiving circuit coupled to the third and fourth terminals receives the first differential signal pair when the first receiving circuit receives the second differential signal pair and the second differential signal pair when the first receiving circuit receives the first differential signal pair. The first selector selects one of a normal signal and an inverted signal output from the first receiving circuit based on a select signal. The second selector selects one of a normal signal and an inverted signal from the second receiving circuit based on the select signal, and the third selector outputs each output from the first and second selectors by switching each output to a first output line and a second output line based on the select signal.

A position to input and a polarity of the first and second differential signal pairs are inverted for the first and second receiving circuits depending on a case where the integrated circuit is mounted on a front surface of the substrate and a case where the integrated circuit is mounted on a back surface of the substrate. According to the first aspect of the invention, the first through fourth terminals are in line symmetry and information on the mounted surface is provided as a select signal. By the first through third selectors that operate according to the select signal, a position and a polarity (normal or inverted) of an output signal from the first and the second receiving circuits are changed.

According to the first aspect of the invention, in a first mode set by the select signal, the first and second selectors select each normal signal of the first and second receiving circuits, and the third selector outputs the normal signal of the first receiving circuit to the first output line and the normal signal of the second receiving circuit to the second output line respectively. Further, in a second mode set by the select signal, the first and second selectors select each inverted signal of the first and second receiving circuits, and the third selector outputs the inverted signal of the first receiving circuit to the second output line and the inverted signal of the second receiving circuit to the first output line respectively.

Accordingly, the output position and the polarity (normal or inverted) of the output signal from the first and second receiving circuits are inverted depending on the first mode or the second mode.

According to the first aspect of the invention, the integrated circuit device further includes an enable signal input terminal formed on each of the first and second receiving circuits, a fourth selector to input first and second enable signals that are different from each other to the enable signal input terminal of the first receiving circuit by switching the first and second enable signals based on the select signal, and a fifth selector to input the first enable signal and a third enable signal that is different from the first enable signal to the enable signal input terminal of the second receiving circuit by switching the first and second enable signals based on the select signal. Each of the fourth and fifth selector selects a signal that is different from another based on the select signal.

Thus, timing of the operation for one of the first and second receiving circuits can be delayed. For example, when the differential signal pair for a clock is input to one of the first and second receiving circuits, the receiving circuit in the side of the differential signal pair for a clock is operated first in either case of the front surface mounting or the back surface mounting so that a sampling signal based on the differential signal pair for a clock can be generated prior to data reception.

According to the first aspect of the invention, each of the first through fourth terminals is formed by a bump. In this way, the integrated circuit device is mounted on a surface of the substrate through the bump and thus the size of the substrate can be reduced compared to a method of wire bonding. At this time, a terminal may be formed by a single bump or a double bump.

According to the first aspect of the invention, the integrated circuit device further includes fifth through eighth terminals. The fifth terminal and the eighth terminal are arranged in line symmetry with respect to the center axis, and the sixth terminal and the seventh terminal are arranged in line symmetry with respect to the center axis. The first and second terminals, the fifth through eighth terminals, and the third and the fourth terminals are arranged in this order. Two receiving blocks each including the first and second receiving circuits and the first through third selectors as a set are formed. Each of these two receiving blocks receives two different differential signal pairs.

Accordingly, by positioning all terminals required for the two receiving blocks in line symmetry, and arranging the first through third selectors on each of the two receiving blocks, the output position and the polarity of the differential signal pair are inverted at each receiving block.

According to the first aspect of the invention, two terminals coupled to one of the first and second transmitting circuits among the first through eighth terminals can receive a differential signal pair for a clock.

A sampling signal of data received from outside is generated based on a differential signal pair for a clock from outside.

According to a second aspect of the invention, an integrated circuit device mountable on both sides of a substrate includes first through fourth terminals arranged in order, a first transmitting circuit, a second transmitting circuit, a first selector, a second selector, and a third selector. The first terminal and the fourth terminal are arranged in line symmetry with respect to a center axis of the first through fourth terminals, and the second terminal and the third terminal are in line symmetry with respect to the center axis. The first transmitting circuit coupled to the first and second terminals outputs one of a first differential signal pair and a second differential signal pair. The second transmitting circuit coupled to the third and fourth terminals outputs the first differential signal pair when the first transmitting circuit outputs the second differential signal pair and the second differential signal pair when the first transmitting circuit outputs the first differential signal pair. The first selector selects one of a normal signal and an inverted signal of a first signal that are a source of the first differential signal pair based on a select signal. The second selector selects one of a normal signal and an inverted signal of a second signal that are a source of the second differential signal pair based on the select signal. The third selector outputs each output from the first and second selectors by switching each output to the first and second transmitting circuits based on the select signal.

An output position and a polarity of the first and second differential signal pairs are inverted for the first and the second transmitting circuits depending on a case where the integrated circuit is mounted on a front surface of the substrate and a case where the integrated circuit is mounted on a back surface of the substrate (hereinafter referred to as a front surface mounting and a back surface mounting). According to the second aspect of the invention, the first through fourth terminals are in line symmetry, and information on the mounted surface is provided as a select signal. By the first through third selectors that operate according to the select signal, a position and a polarity (normal or inverted) of an output signal from the first and the second transmitting circuits are changed.

According to the second aspect of the invention, the first and second selector select each normal signal of the first and second signals, and the third selector outputs the normal signal of the first signal to the first transmitting circuit and the normal signal of the second signal to the second transmitting circuit respectively in a first mode set by the select signal while the first and the second selector select each inverted signal of the first and second signals, and the third selector outputs the inverted signal of the first signal to the second transmitting circuit and the inverted signal of the second signal to the first transmitting circuit respectively in a second mode set by the select signal.

Accordingly, the output position and the polarity (normal or inverted) of the output signal from the first and second transmitting circuits are inverted depending on the first mode or the second mode.

In the second aspect of the invention, each of the first through fourth terminals is formed by a bump according to the same reason for that of the first aspect of the invention.

According to the second aspect of the invention, the integrated circuit device further includes fifth through eighth terminals. The fifth terminal and the eighth terminal are arranged in line symmetry with respect to the center axis, and the sixth terminal and the seventh terminal are arranged in line symmetry with respect to the center axis. The first and second terminals, the fifth through eighth terminals, and the third and fourth terminals are arranged in this order. Two transmitting blocks each including the first and second transmitting circuits and the first through third selectors as a set are formed. Each of these two transmitting blocks receives two different differential signal pairs.

Accordingly, by positioning all terminals required for the two transmitting blocks in line symmetry, and arranging the first through third selectors on each of the two transmitting blocks, the output position and the polarity of the differential signal pair are inverted at each transmitting block.

Among the first through eighth terminals, two terminals coupled to one of the first and second transmitting circuits output a differential signal pair for a clock.

By outputting the differential signal pair for a clock as well as a differential signal pair for data, data based on the differential signal pair for data is sampled in the receiving circuit to receive the differential signal pair for data according to the sampling clock based on the differential signal pair for a clock.

According to the first and second aspects of the invention, the integrated circuit device further includes two of first input terminals which receive a first power supply potential and two of second input terminals which receive a second power supply potential different from the first power supply potential. The two of the first input terminals are arranged in line symmetry with respect to the center axis as well as the two of the second input terminals are arranged in line symmetry with respect to the center axis.

In this case, when a position of the power supply input terminal is inverted because of the front surface mounting or the back surface mounting, the same types of the power supply input terminal is arranged in a line symmetry position, a constant power supply potential is always input without forming a selector.

According to a third aspect of the invention, an electronic apparatus includes a substrate having a main circuit mounted on a front surface of the substrate, and the integrated circuit device mounted on the front surface of the substrate. The select signal is set at logic for a front surface mounting. Alternatively, this electronic apparatus includes a substrate having a main circuit mounted on a front surface of the substrate, and the integrated circuit device mounted on the back surface of the substrate. The select signal is set at logic for a back surface mounting.

An electronic apparatus such as these switches an integrated circuit device having the same configuration to a front surface mounting type or a back surface mounting type by logic of a select signal.

The substrate to be mounted on the electronic apparatus may further include a flexible printed circuit board that is coupled to a signal pattern formed on a surface on which the integrated circuit device is mounted. This flexible printed circuit board may be used for both the front surface mounting type and the back surface mounting type.

BRIEF DESCRIPTION OF THE DRAWINGS

The invention will be described with reference to the accompanying drawings, wherein like numbers reference like elements.

DESCRIPTION OF EXEMPLARY EMBODIMENTS

An embodiment of the invention will be described with reference to the accompanying drawings. The embodiment described below is not intended to unreasonably limit the invention set forth in the claims. Also, it should be understood that not all of the elements described below are required to put the invention into practice. Note that like numerals indicate like elements throughout the drawings.

Display Driver

Figure 1A:
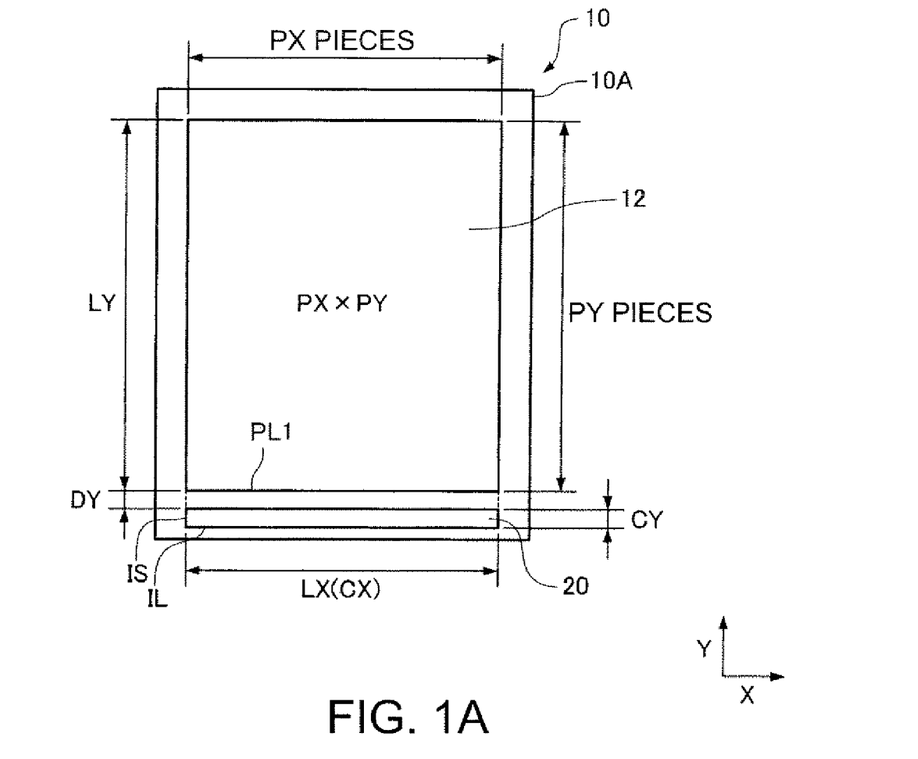
FIGS. 1A and 1B are diagrams showing an integrated circuit device according to an embodiment of the invention.

FIG. 1A shows a display panel 10 on which a display driver 20 (an integrated circuit device in a broad sense) is mounted. In this embodiment, the display driver 20 or the display panel 10 having the display driver 20 thereon can be mounted on a small-sized electronic apparatus (not shown). Examples of the small-sized electronic apparatus are a cellular phone, a PDA and a digital music player having a display panel. The display panel 10 is, for example, a glass substrate 10A having a plurality of display pixels thereon. Corresponding to the display pixels, a plurality of data lines (not shown) extending in the Y direction and scanning lines (not shown) extending in the X direction are formed on the display panel 10. The display pixels formed on the display panel 10 in the embodiment are liquid crystal elements. However, not limited to this, the display pixels may be light emitting elements such as an electro luminescence (EL). Further, the display pixels can be an active type with a transistor or the like, or a passive type without a transistor or the like. For example, when an active type is applied to a display area 12, the liquid crystal pixels can be an amorphous thin film transistor (TFT) or a low-temperature polysilicon TFT.

The size of the display driver 20 is set at CX for a length in the X direction and CY for a length in the Y direction. A long edge IL of the display driver 20, which is the length CX, is parallel to an edge PL1 in the side of the display driver 20 in the display area 12. That is, the display driver 20 is mounted on the display panel 10 so that the long edge IL is parallel to PL1 that is one of the edges of the display area 12.

Figure 1B:
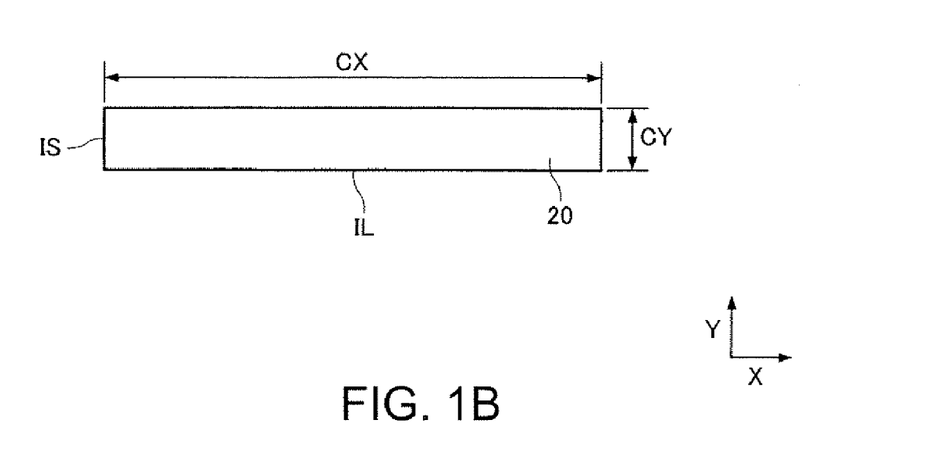

FIG. 1B is a diagram showing the size of the display driver 20. The ratio between a short edge IS of the display driver 20, which is the length CY, and the long edge IL of the display driver 20 is from 1:9 to 1:11. The setting of the short edge IS is very short compared to the long edge IL. This long and thin shape can minimize the chip size in the Y direction of the display driver 20.

According to FIG. 1A, a length LX in the X direction in the display area 12 is equal to the length CX in the X direction in the display driver 20. Although it is not limited to FIG. 1A especially, it is preferable that the length LX be equal to the length CX like this. The reason is shown in FIG. 2A.

Figure 2A:
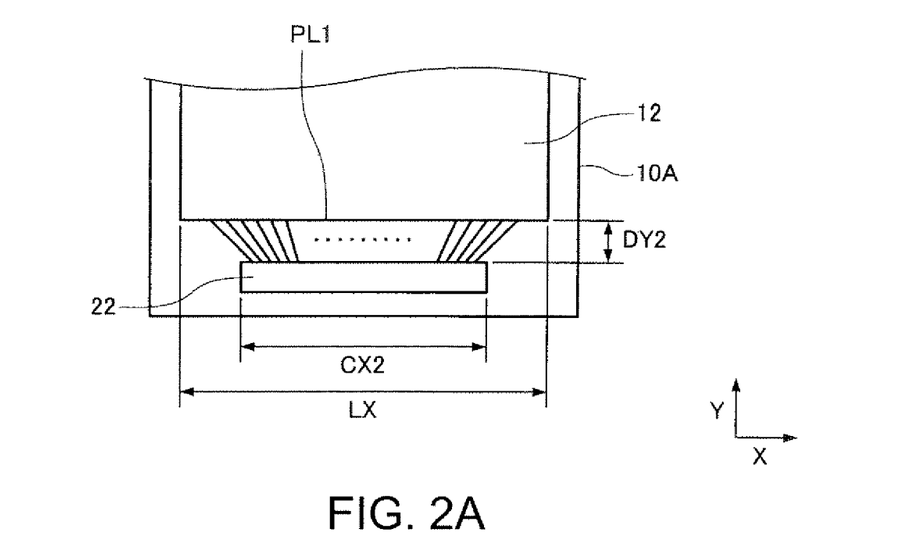
FIG. 2A is a diagram showing a part of a comparative example according to the embodiment.

As for a display driver 22 shown in FIG. 2A, a length in the X direction is set at CX2. As the length CX2 is shorter than the length LX of the edge PL1 in the display area 12, a plurality of wiring to couple the display driver 22 and the display area 12 are not arranged to be parallel to the direction Y as shown in FIG. 2A. Therefore, DY2 that is a distance between the display area 12 and the display driver 22 needs to be arranged additionally. This prevents cost reduction because the size of the glass substrate 10A for the display panel 10 needs to be larger more than necessary. Further, when the display panel 10 is mounted on even smaller-sized electronic apparatus, a portion other than the display area 12 becomes larger and this also prevents downsizing of the electronic apparatus.

Figure 2B:
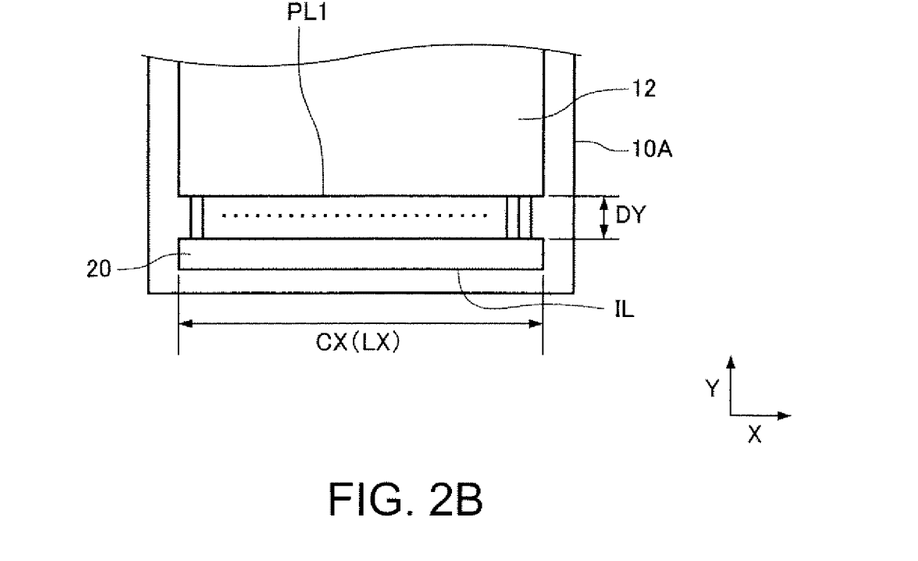
FIG. 2B is a diagram showing a part of the integrated circuit device according to the embodiment.

On the contrary, as for the display driver 20 of the embodiment as shown in FIG. 2B, the length CX of the long edge IL is formed so as to be equal to the length LX of the edge PL1 in the display area 12. Therefore, a plurality of wiring between the display driver 20 and the display area 12 are arranged in parallel in the Y direction. Thus the distance DY between the display driver 20 and the display area 12 is shorter compared to the case shown in FIG. 2A. Further, as the length IS in the Y direction of the display driver 20 is short, the glass substrate 10A of the display panel 10 is downsized in the Y direction and this contributes to downsizing of the electronic apparatus.

In the embodiment, the length CX of the long edge IL of the display driver 20 is formed so as to be equal to the length LX of the edge PL1 in the display area 12. However, this is not intended to limit the structure. For example, when the long edge IL of the display driver 20 is arranged longer than the length LX of the edge PL1 in the display area 12, the same advantageous effect is obtained.

Figure 3:
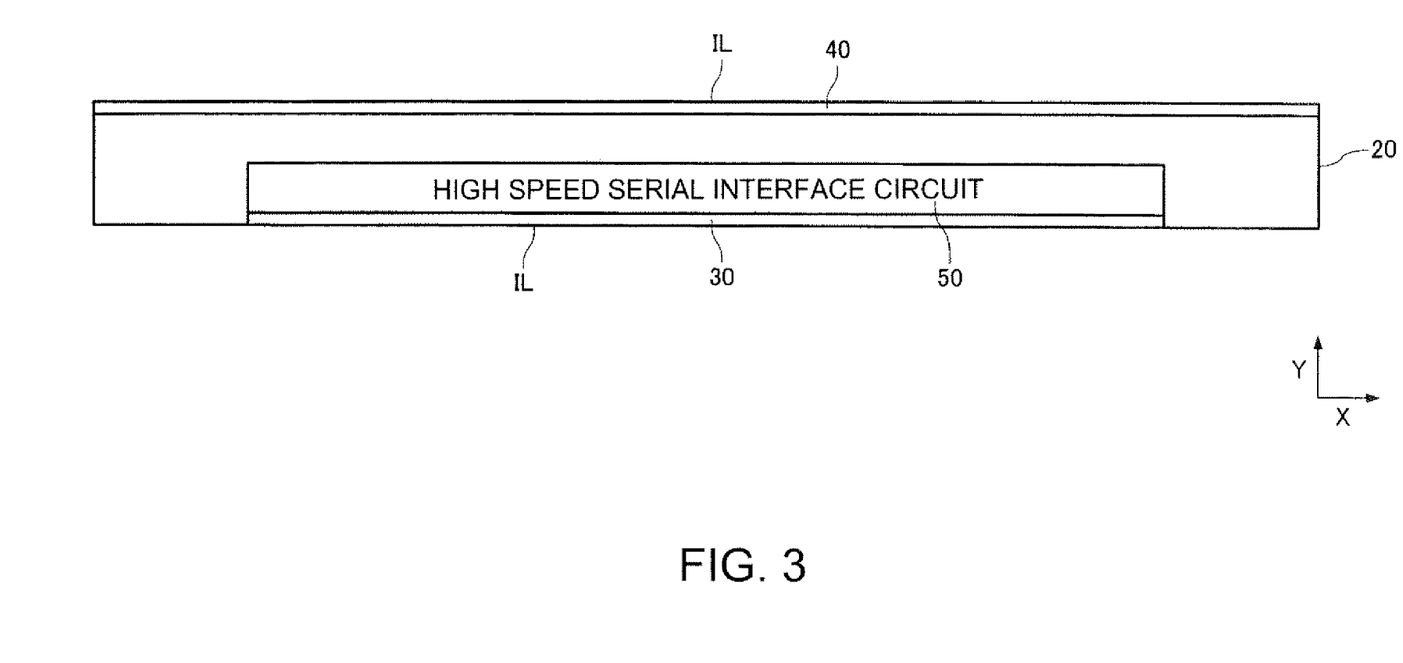
FIG. 3 is a diagram showing a part of a plan layout of the integrated circuit device according to the embodiment.

As shown in FIG. 3, an input pad area 30 and an output pad area 40 are formed along the two long edges IL of the display driver 20. Further, the display driver 20 is in a central area in the X direction along the long edge IL and includes a high speed serial interface circuit (an interface circuit in a broad sense) 50 in an area inside of the input pad area 30. The reason for making such arrangement is that a data signal input to the high speed serial interface circuit 50 is important. When the high speed serial interface circuit 50 is in the central area of the long edge IL, a pad coupled thereto is also arranged in the central area of the long edge IL. In the embodiment, a bump is formed on the pad and coupled to a pattern on a glass substrate via conductive adhesive. Contact of the bump in the central area of the long edge IL of the display driver 20 is more favorable than that in the both edges and failure of the data signal caused by poor contact does not occur.

High Speed Serial Interface Circuit

Figure 4:
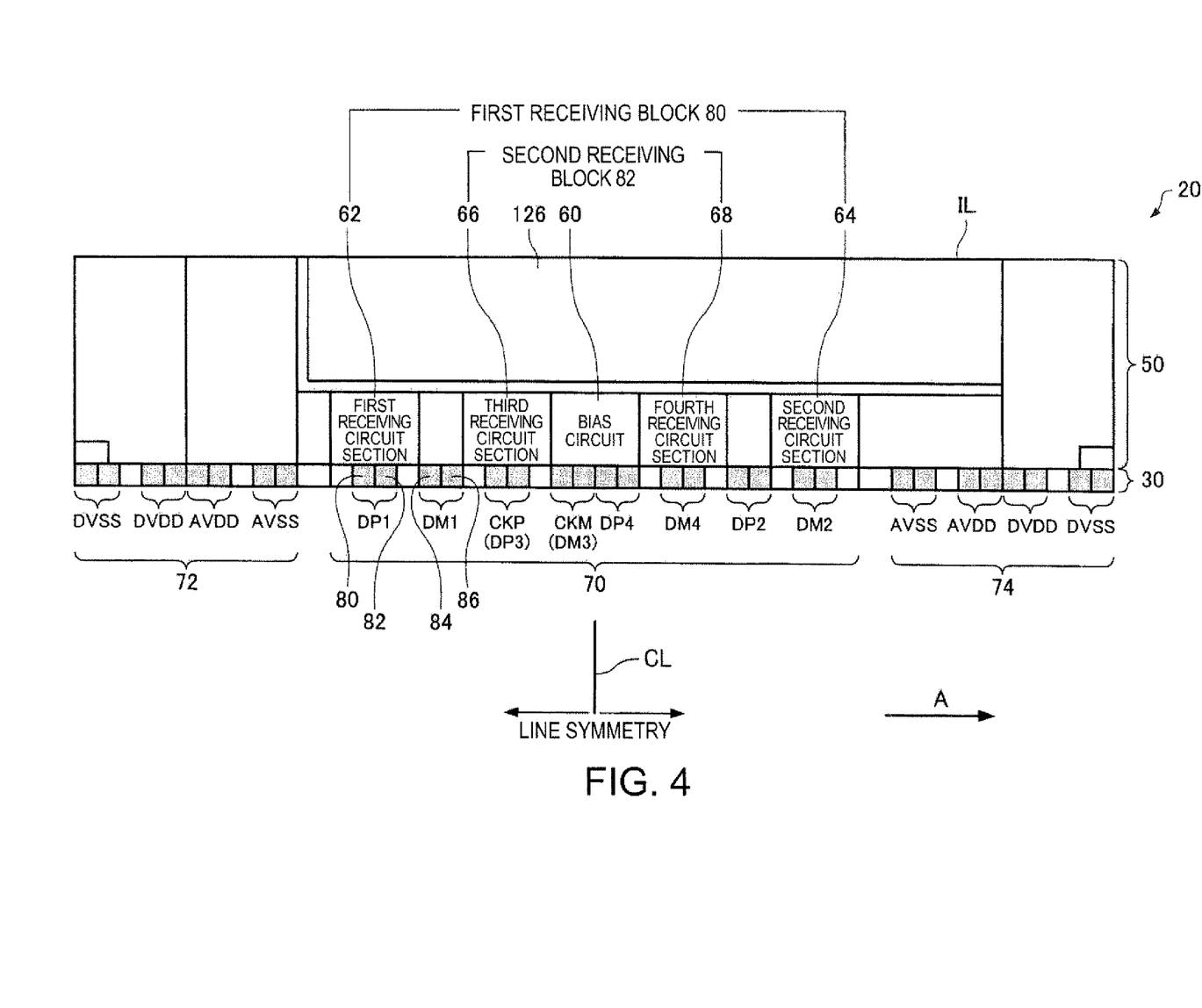
FIG. 4 is an enraged plan view of a high speed serial interface circuit shown in FIG. 3 and an input pad area corresponding to the high speed serial interface circuit.

FIG. 4 is an enlarged plan view of the high speed serial interface circuit 50 and the input pad area 30 corresponding to the high speed serial interface circuit 50. The high speed serial interface circuit 50 has a bias circuit 60 arranged in the central area of the long edge IL of the display driver 20. For example, in the both sides of the bias circuit 60, two of four receiving circuit sections, a first receiving circuit section 62, a second receiving circuit section 64, a third receiving circuit section 66, and a fourth receiving circuit section 68, are arranged each side. The first receiving circuit section 62 and the second receiving circuit section 64 are arranged in line symmetry with respect to a center axis CL that divides an edge of the display driver into two, for example. In the same manner, the third receiving circuit section 66 and the fourth receiving circuit section 68 are arranged in line symmetry with respect to the center axis CL. The bias circuit 60 provides such as a constant voltage and an enable signal to the first receiving circuit section 62 through the fourth receiving circuit section 68. The input pad area 30 has a differential signal input area 70 in the central area of the long edge IL. A first power supply input area 72 and a second power supply input area 74 are arranged on the both sides of the differential signal input area 70.

In the input pad area 30, four bumps corresponding to each of the first receiving circuit 62 through fourth receiving circuit 68, that is 16 bumps in total, are formed. For example, four bumps, which are bumps 80, 82, 84, and 86, corresponding to the first receiving circuit 62 are formed. In the embodiment, the first receiving circuit 62 through fourth receiving circuit 68 are receiving circuit sections for a differential signal pair (DP and DM). A differential signal DP means D+ whereas the differential signal DM means D−. As described later, when the display driver 20 is mounted on the front surface of the substrate 10A, a first differential signal pair (DP1 and DM1) is input to the first receiving circuit section 62 via the bumps 80 through 86. Accordingly, a second differential signal pair (DP2 and DM2) is input to the second receiving circuit section 64, a third differential signal pair (DP3 and DM3) is input to the third receiving circuit section 66, and a fourth differential signal pair (DP4 and DM4) is input to the fourth receiving circuit section 68. The second differential signal pair (DP2 and DM2) is a differential signal pair for a clock (CKP and CKM) in the embodiment.

Figure 5:
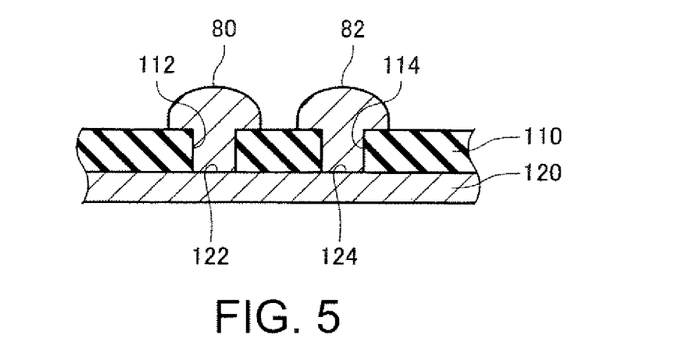
FIG. 5 is a sectional view of a double bump shown in FIG. 4.

As shown in FIG. 5, a pair of neighboring bumps, for example, the bumps 80 and 82 are formed on two of pads 122 and 124 (first and second pads, or a differential signal input pad) by Au or the like. The pads 122 and 124 are formed on a metal layer 120 on the top surface (the fifth metal layer in the embodiment) that is exposed in openings 112 and 114 formed in a passivation film 110. This pair of the bumps 80 and 82 is a double bump that is conducted at the metal layer 120, and the both of the bumps 80 and 82 receive the differential signal DP1 that is one of the first differential signal pair (DP1 and DM1) in the embodiment. Accordingly, in the embodiment, the two bumps, which are the bumps 80 and 82, form a terminal in a broad sense. As a matter of course, this terminal may be a pad, a bump or a double bump as it is in the embodiment.

Each of other pairs of bumps forms a double bump in the same manner, and each pair of the bumps is formed as a terminal that receives a common signal.

On the both sides of the bumps for the differential signal pair, a pair of bumps for each VSS power supply for analog (AVSS: a first power supply in a broad sense) is formed. This pair of the bumps is coupled to a first power supply voltage input pad that is not shown. Further, in the outside of the above-mentioned bumps, a pair of bumps for each VDD power supply for analog (ADVV: a second power supply in a broad sense) is formed. This pair of the bumps is also coupled to a second power supply voltage input pad that is not shown. On the both edges of the power supply input areas 72 and 74, a pair of bumps for each VDD power supply for logic (DVDD: a second power supply voltage in a broad sense) is formed and also coupled to the second power supply voltage input pad that is not shown. Further, in the outside of the above-mentioned bumps, a pair of bumps for each VSS power supply for logic (DVSS: a first power supply voltage in a broad sense) is formed. This pair of the bumps is coupled to the first power supply voltage input pad that is not shown.

Thus, by applying a double bump to the bump for the differential signal, contact resistance in the middle of a differential signal line is lowered and low impedance is achieved so as to prevent delay and corruption of the differential signal. In addition, the double bump makes it possible to measure terminating resistance with high accuracy by using a four-terminal method that can use the bump as a current supply terminal or a voltage measuring terminal.

Here, as shown in FIG. 4, all terminals aligned along a first direction A are arranged in line symmetry with respect to the center axis CL of these terminals aligned. In FIG. 4, the terminal DP1 and the terminal DM2 are arranged in line symmetry, the terminal DM1 and the terminal DP2 are arranged in line symmetry, the terminal DP3 and the terminal DM4 are arranged in line symmetry, and the terminal DM3 and the terminal DP4 are arranged in line symmetry. In addition, the same power supply terminals arranged in the power supply input areas 72 and 74 are also arranged in line symmetry. The center axis CL is not necessarily in the center axis of the display driver 20 as long as the center of the terminal arrangement is shown.

Figure 6:
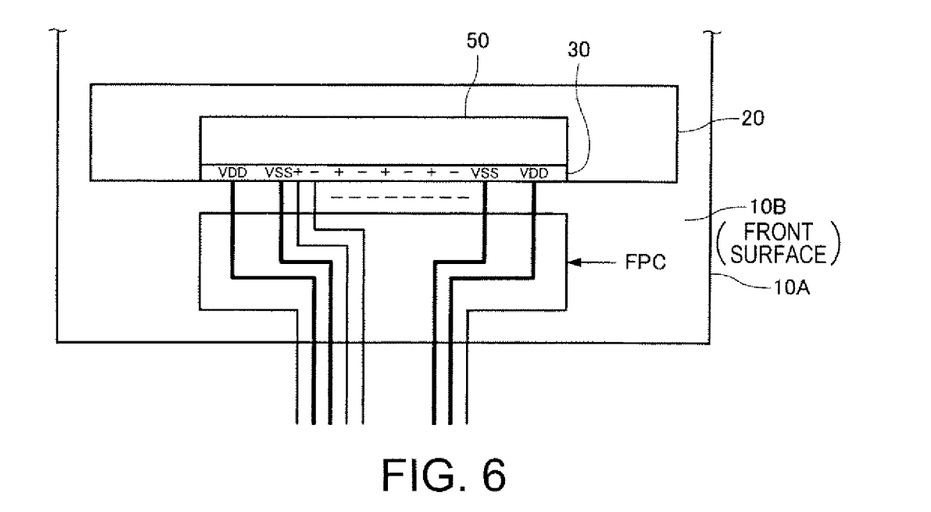
FIG. 6 is a diagram showing a display driver mounted on a front surface of a glass substrate.
Figure 7:
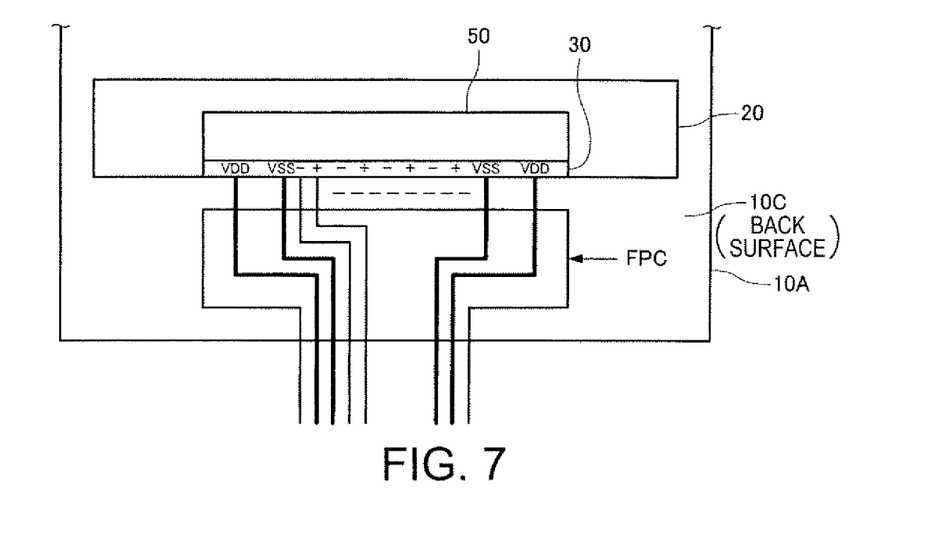
FIG. 7 is a diagram showing a display driver mounted on a back surface of a glass substrate.
Figure 8:
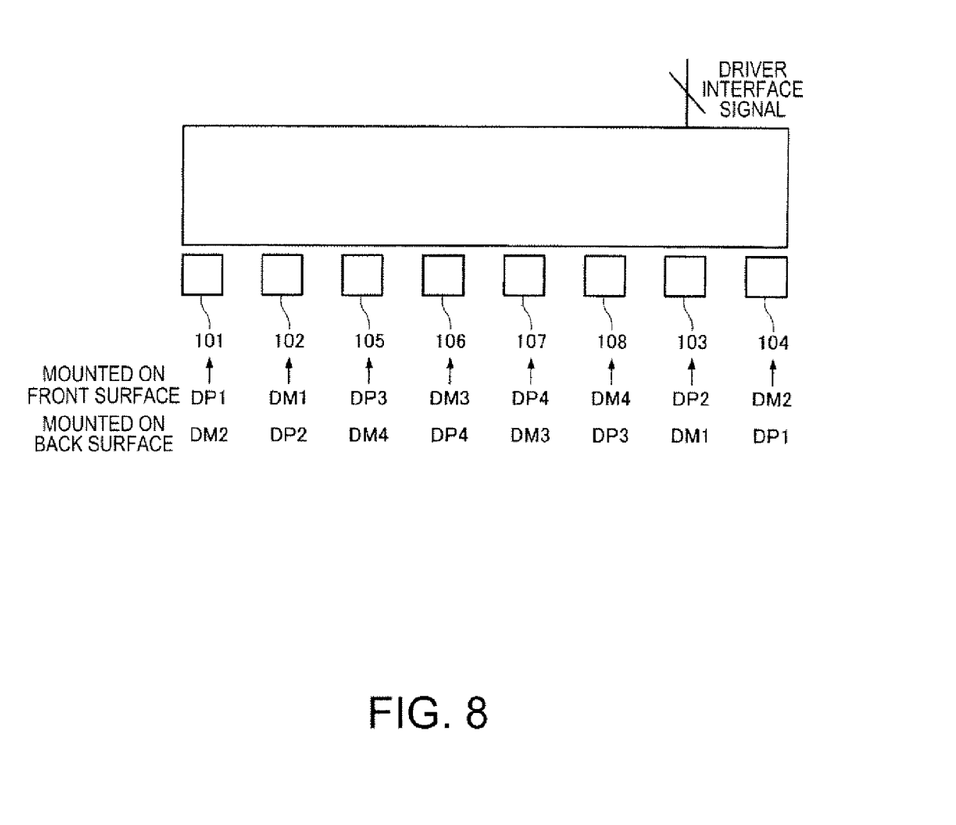
FIG. 8 is a diagram showing a position and a polarity of a differential signal pair that is inverted for a front surface mounting or a back surface mounting.

FIG. 6 schematically illustrates a state in which the display driver 20 is mounted on a front surface 100B of the glass substrate (a substrate in a broad sense) 10A where the display panel 10 is formed, and the display driver 20 and a host (not shown) are coupled by a flexible printed circuit board (FPC). FIG. 7 schematically shows a state in which the display driver 20 and the FPC that are the exactly same as ones in FIG. 6 are mounted on a back surface 10C of the glass substrate 10. It is a diagram showing a position and a polarity of the differential signal pair that is inverted depending on a front surface mounting or a back surface mounting. Although a double bump is applied in FIG. 4, an example to apply a single bump is shown in FIGS. 6 through 8 for simplifying the description. In addition, in FIGS. 6 and 7, for VDD and VSS, a case only for analog is shown without categorizing the cases for analog and logic. A terminal 101 in FIG. 8 corresponds to the double bumps 80 and 82 in FIG. 4, and a terminal 102 corresponds to the double bumps 84 and 86 in FIG. 4.

As shown in FIG. 8, in a case of the front surface mounting in FIG. 6 and a case of the back surface mounting in FIG. 7, the positions and the polarities (+ or −) of four differential signal pairs are inverted. That is, as shown in FIG. 8, the terminal DP1 positioned in the left edge in the case of the front surface mounting moves to the right edge that is in a line symmetry position with respect to the center axis CL in the case of the back surface mounting. On the contrary, the terminal DM2 positioned in the left edge in the case of the back surface mounting moves to the right edge that is in a line symmetry position with respect to the center axis CL in the case of the front surface mounting.

When it is seen from the side of the display driver 20, DP1 is input to the terminal 101 in FIG. 8 in the case of the front surface mounting shown in FIG. 6 while DM2 is input to the terminal 101 in the case of the back surface mounting shown in FIG. 7. In the same manner, DM1 is input to the terminal 102, which is one of the other terminals, in the case of the front surface mounting shown in FIG. 6 while DP2 is input to the terminal 102 in the case of the back surface mounting shown in FIG. 7. That is, if the first receiving circuit section 60 and second receiving circuit section 62 shown in FIG. 4 perform as a first receiving block 80, the signal needs to be switched in this first receiving block 80. In the same manner, if the third receiving circuit section 66 and fourth receiving circuit section 68 shown in FIG. 4 perform as a second receiving block 82, the signal needs to be switched in this second receiving block 82.

Switch Circuit for Receiving that is Mountable on Both Sides of a Substrate

Figure 9:
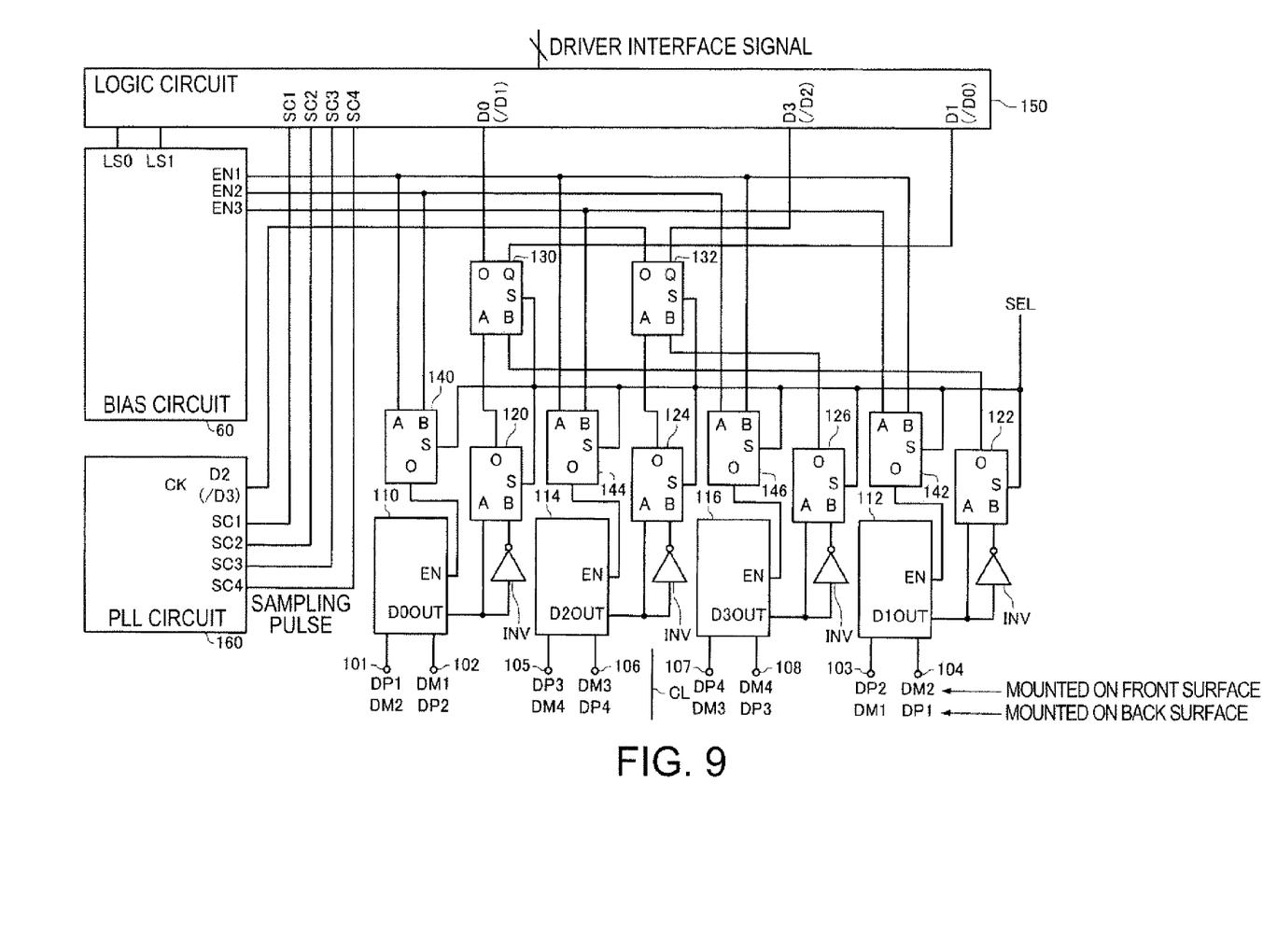
FIG. 9 is a block diagram showing two blocks of receiving circuits.

FIG. 9 shows details of the first receiving circuit 62 through the fourth receiving circuit 68 formed in the display driver 20 to realize both the front surface mounting in FIG. 6 and the back surface mounting in FIG. 7.

In FIG. 9, eight pairs of double bumps (16 bumps in total) shown in FIG. 4 are referred to as eight terminals 101 through 108 (first through eighth terminals in broad sense).

In FIG. 9, a first receiving circuit 110 is coupled to the terminal 101 (the first terminal in a broad sense) and the terminal 102 (the second terminal in a broad sense), and receives one of the first differential signal pair (DP1 and DM1) and the second differential signal pair (DM2 and DP2). The second receiving circuit 112 is coupled to the terminal 103 (the third terminal in a broad sense) and the terminal 104 (the fourth terminal in a broad sense), and receives one of the other differential signal pairs, which is not input to the first receiving circuit 110, between the first differential signal pair (DM1 and DP1) and the second differential signal pair (DP2 and DM2).

In the same manner, the third receiving circuit section 114 is coupled to the terminal 105 (the fifth terminal in a broad sense) and the terminal 106 (the sixth terminal in a broad sense), and receives one of the third differential signal pair (DP3 and DM3) and the fourth differential signal pair (DM4 and DP4). The fourth receiving circuit 116 is coupled to the terminal 107 (the seventh terminal in a broad sense) and the terminal 108 (the eighth terminal in a broad sense), and receives one of the other differential signal pairs, which is not input to the third receiving circuit 114, between the third differential signal pair (DM3 and DP3) and the fourth differential signal pair (DP4 and DM4).

Here, the first receiving circuit section 110 through the fourth receiving circuit section 116 are, for example, differential comparators that output a comparison output based on a differential signal pair which is input.

Each data output terminal of the first receiving circuit section 110 through the fourth receiving circuit section 116 is divided into two routes and one of the routes is coupled to an inverter INV. Therefore, each of output signals D0 through D3 of the first receiving circuit section 110 through the fourth receiving circuit section 116 is converted into a normal signal and an inverted signal thereof. This is, as it is described later, to correct a polarity (+ or −) of the differential signal pair since the polarity is input inversely depending on the mounting structure described in FIGS. 6 and 7.

A normal signal and an inverted signal according to an output signal from each of the first receiving circuit section 110 through the fourth receiving circuit section 116 are input to first data selector 120 through fourth data selector 126 on a first stage. The first data selector 120 and the third data selector 124 on the first stage perform as a first selector in a broad sense, and the second data selector 122 and the fourth data selector 126 on the first stage perform as a second selector in a broad sense. A corresponding normal signal of the receiving circuit is input to a terminal A for each of the data selectors 120 through 126 whereas an inverted signal in which the normal signal is inverted by an inverter INV is input to a terminal B thereof. The first data selector 120 through the fourth data selector 126 on the first stage select one of the normal signal and the inverted signal according to an output from the each corresponding receiving circuit based on logic of a common select signal SEL that is input from a select terminal (S) in order to output from an output terminal (O).

The first data selector 120 and the second data selector 122 on the first stage are first and second selectors formed in the first receiving block 80 shown in FIG. 4 in a broad sense. On the other hand, the third data selector 124 and the fourth data selector 126 on the first stage are formed in the second receiving block 82 shown in FIG. 4, and form another pair of first and second selectors in a broad sense.

Figure 10:
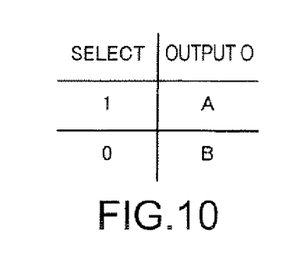
FIG. 10 is a table showing switch logic at first through fourth data selectors on a first stage in FIG. 9.

FIG. 10 shows a relationship between a select signal and an output to be selected. That is, when the select signal SEL is logic "1" (Front surface mounting: a first mode in a broad sense), the normal signal of the terminal A is selected. Further, when the select signal SEL is logic "0" (Back surface mounting: a second mode in a broad sense), the polarity of the differential signal pair is inverted from the polarity in the case of the front surface mounting. Therefore, the inverted signal of the terminal B is selected. In the embodiment, the logic of the select signal SEL in the case of the front surface mounting in FIG. 6 is set at "1" and the logic of the select signal SEL in the case of the back surface mounting in FIG. 7 is set at "0" respectively, however, the logic can be set inversely. On the display driver 20, a fuse or a register is arranged as a setting method of the select signal SEL, for example. The logic of this select signal SEL can be set by a user depending on the mounting structure or by an IC manufacturer when the display driver 20 is manufactured if the mounting structure is decided by the lot in advance.

Figure 11:
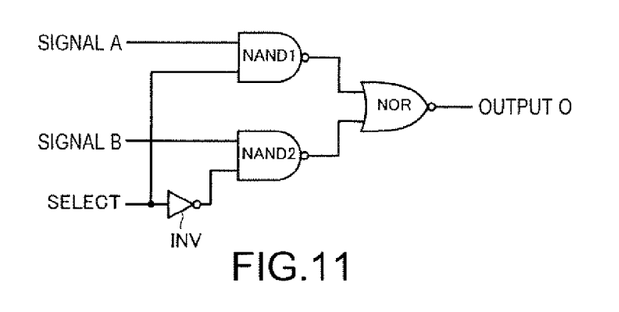
FIG. 11 is a diagram showing an example of a circuit for the first through fourth data selectors and the first through fourth enable signal selectors on the first stage in FIG. 9.

FIG. 11 shows an example of a circuit to realize logic of a truth table shown in FIG. 10. Each of the first data selector 120 through the fourth data selector 126 on the first stage has a common structure shown in FIG. 11. In FIG. 11, each of the first data selector 120 through the fourth data selector 126 has two nand circuits NAND 1 and 2, a nor circuit NOR, and an inverter INV. One of the nand circuits, Nand 1, receives a normal signal from a input terminal A and a select signal SEL while the other nand circuit, NAND 2, receives an inverted signal from an input terminal B and an inverted signal of the select signal SEL. The nor circuit NOR receives outputs from two of the nand circuits NAND 1 and 2, and outputs a selector output O.

In FIG. 9, on the next row of the first stage in which the first data selector 120 through the fourth data selector 126 are formed, the first data selector 130 and the second data selector 132 (a third selector in a broad sense) on the second stage are formed. To the first data selector 130 on the second stage, outputs of the first data selector 120 and the second data selector 122 on the first stage are input. To the second data selector 132 on the second stage, outputs of the third data selector 124 and the fourth data selector 126 on the first stage are input.

Each of these data selectors, the first data selector 130 and the second data selector 132 on the second stage, has two input terminals (A and B), two output terminals (O and Q), and a select signal input terminal (S), so that a direction of a signal of the data selector is switched depending on the mounting structure. The first data selector 130 and the second data selector 132 on the second stage switch input signals from the input terminals (A and B) based on the logic of the select signal SEL input from the select terminal (S) to output from the output terminals (O and Q).

Figure 12:
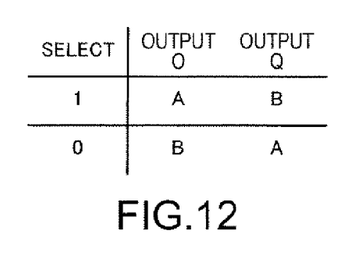
FIG. 12 is a table showing switch logic at the first and second data selectors on a second stage in FIG. 9.

FIG. 12 shows a relationship between a select signal and an output to be switched. That is, if the logic of the select signal SEL is "1" (in the case of the front surface mounting), a signal from the input terminal A is output from the output terminal O, and a signal from the input terminal B is output from the output terminal Q. On the contrary, if the logic of the select signal SEL is "0" (in the case of the back surface mounting), the signal from the input terminal B is output from the output terminal O, and the signal from the terminal A is output from the output terminal Q.

Thus, in the case of the front surface mounting, the normal signals D0, D1 and D3 from the first receiving circuit section 110, the second receiving circuit section 112, and the fourth receiving circuit section 116 are input to a logic circuit 150, and a normal signal D2 from the third receiving circuit 114 is input to a PLL circuit 160 as a clock signal CK. On the contrary, in the case of the back surface mounting, the inverted signals /D0, /D1 and /D2 from the first receiving circuit section 110, the second receiving circuit section 112, and the third receiving circuit section 114 are input to the logic circuit 150, and an inverted signal /D3 from the fourth receiving circuit 116 is input to the PLL circuit 160 as the clock signal CK.

Here, by the switch mentioned above, relation that is D0=/D1, D1=/D0, D2=/D3, and D3=/D2 is established between the normal signals D0 through D3 selected in the case of the front surface mounting and the inverted signals /D0 through /D3 selected in the case of the back surface mounting. Therefore, regardless of the front surface mounting or the back surface mounting, data signals based on the first differential signal pair (DP1 and DM1), the second differential signal pair (DP2 and DM2) and the fourth differential signal pair (DP4 and DM4) are input to each position of three points on the logic circuit 150 while the clock signal CK based on the third differential signal pair (DP3 and DM3: a differential signal pair for a clock) is input to the PLL circuit 160. The PLL circuit 160 outputs, for example, sampling pulses SC1 through SC4 to the logic circuit 150 based on the clock signal CK that is input. The logic circuit 150 samples the signals (D0, D1 and D3) or (/D0, /D1 and /D2) that are input, based on the sampling pulses SC1 through SC4, and outputs them in parallel as driver interface signals.

Figure 13:
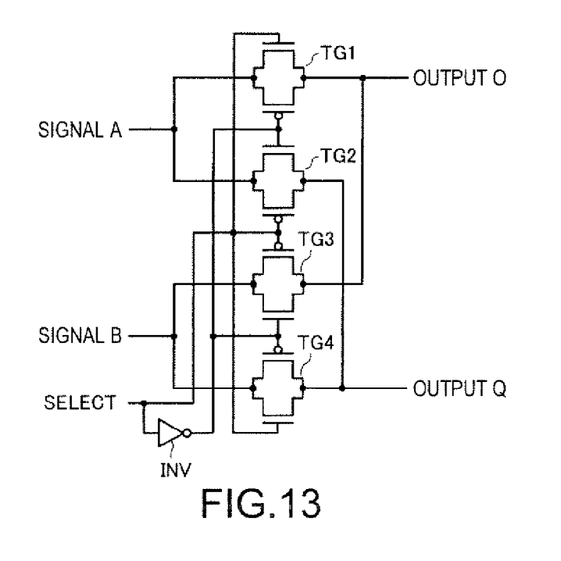
FIG. 13 is a table showing an example of a circuit for the first and second data selectors on the second stage in FIG. 9.

FIG. 13 shows an example of a circuit to realize logic of a truth table shown in FIG. 12. Each of the first data selector 130 and the second data selector 132 on the second stage has a common structure shown in FIG. 12. As shown in FIG. 13, four transfer gates TG1 through TG4 and an inverter INV are formed. The transfer gates TG1 and TG2 receive a same signal from the input terminal A while the transfer gates TG3 and TG4a receive a same signal from the input terminal B. Output lines of the transfer gates TG1 and TG3 are coupled to the output terminal O and output lines of the transfer gates TG2 and TG4 are coupled to the output terminal Q. Further, the normal signal and the inverted signal of the select signal SEL are input to each of the transfer gates TG1 through TG4 to realize logic of the truth table shown in FIG. 12.

As shown in FIG. 9, the bias circuit 60 outputs first enable signal EN1 through third enable signal EN3 in order to enable the first receiving circuit section 110 through the fourth receiving circuit section 116, for example. First enable signal selector 140 through the fourth enable signal selector 146 are formed so as to switch any two of the first enable signal EN1 through the third enable signal EN3, and input the signal to each enable signal input terminal EN of the first receiving circuit section 110 through the fourth receiving circuit section 116. The first enable signal selector 140 through the fourth enable signal selector 146 are formed according to the circuit shown in FIG. 11, which is operated based on the truth table shown in FIG. 10, as well as the first data selector 120 through the fourth data selector 126 on the first stage.

As shown in FIG. 9, the first enable signal selector 140 (a fourth selector in a broad sense) outputs any one of the first enable signal EN1 input to the terminal A and the second enable signal EN2 input to the terminal B from the output terminal O based on the logic of the select signal SEL input to the select signal input terminal S according to the truth table shown in FIG. 10. The second enable signal selector 142 (a fifth selector in a broad sense) outputs any one of the third enable signal EN3 input to the terminal A and the first enable signal EN1 input to the terminal B from the output terminal O based on the logic of the select signal SEL input to the selector signal input terminal S according to the truth table shown in FIG. 10. The third enable signal selector 144 performs as the fourth selector in a broad sense. The terminal A receives the first enable signal EN1 and the terminal B receives the third enable signal EN3. The fourth enable signal selector 146 performs as the fifth selector in a broad sense. The terminal A receives the second enable signal EN2 and the terminal B receives the first enable signal EN1.

In operation, the first timing signal EN1 is activated first in either case of the front surface mounting or the back surface mounting. In the case of the front surface mounting, the first enable signal selector 140 and the third enable signal selector 144 that select the terminal A operate, and the output D2 of the third receiving circuit 114 is input to the PLL circuit 160 as the clock signal CK. As a result, the sampling pulses SC1 through SC4 are generated at the PLL circuit 160. In the case of the back surface mounting, the second enable signal selector 142 and the fourth enable signal selector 146 that select the terminal B operate, and the output /D1 of the second receiving circuit 112 is input to the logic circuit 150 and the output /D3 of the fourth receiving circuit is input to the PLL circuit 160 as the clock signal CK. When the first enable signal EN1 is activated, the output D0 of the first receiving circuit 110 can be input to the logic circuit 150. However, the first differential signal pair (DP1 and DM1) is not input at this time.

After the generation of the sampling pulses SC1 through SC4, the second enable signal EN2 and the third enable signal EN3 are also activated. Thus, the outputs D0 and D2 (in the case of the front surface mounting) or /D0 and /D2 (in the case of the back surface mounting) from the first receiving circuit section 110 and the third receiving circuit section 114 can be input to the logic circuit 150. In this way, when signals are received, the clock signal CK is always generated at the PLL circuit 160 in advance. Therefore, when the outputs D0, D1 and D3, or /D0, /D1 and /D2 are input to the logic circuit 150 at the same time, sampling operation based on the clock signal CK is properly performed.

Switch Circuit for Transmitting that is Mountable on Both Sides of a Substrate

The first receiving circuit section 62 through the fourth receiving circuit section 68 shown in FIG. 4 can be changed into first through fourth receiving and transmitting circuit sections or first through fourth transmitting circuit sections. At this time, the first terminal 101 through the eighth terminal 108 operate as input and output terminals or output terminals. In any of these cases, the display driver 20 will have two transmitting circuit blocks shown in FIG. 14, for example.

Figure 14:
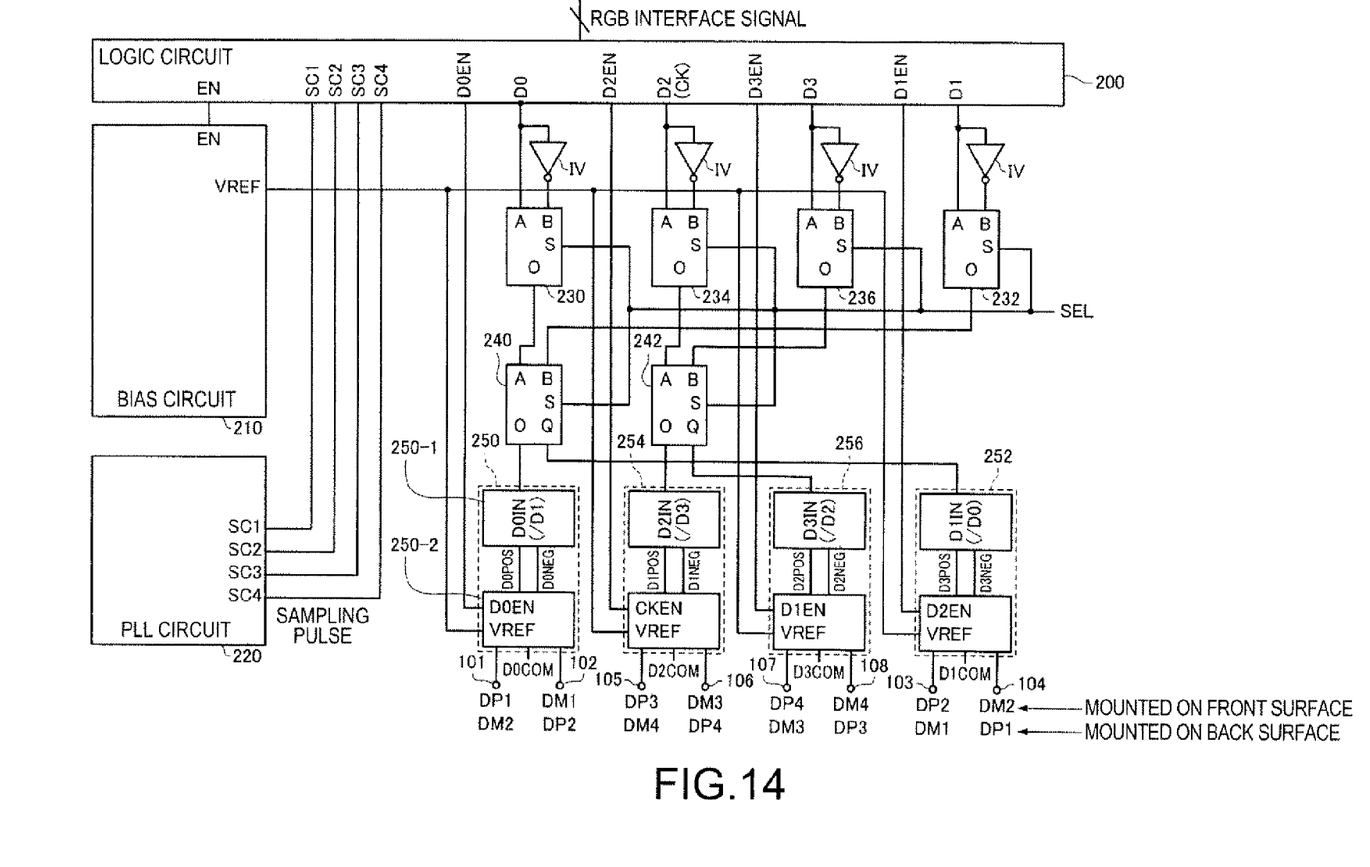
FIG. 14 is a block diagram showing two blocks of transmitting circuits.

When a transmitting and receiving function is included, a logic circuit 200 shown in FIG. 14 does not need to be formed as the logic circuit 150 shown in FIG. 9 can be used. The logic circuit 200 receives a RGB interface signal in parallel. An example of the RGB interface signal is, when data of a liquid crystal display data RAM in the display driver 20 is rewritten by a command from a MPU outside, a signal to read the data rewritten to the MPU side. In this case, the logic circuit 200 outputs the signals D0, D1, D2 (CK), and D3 in serial. Further, the logic circuit 200 receives an enable signal EN from a bias circuit 210 and sampling pulses SC1 through SC4 from a PLL circuit 220. When the logic circuit 200 shown in FIG. 14 has a transmitting and receiving function, the bias circuit 210 and the PLL circuit 220 shown in FIG. 14 does not need to be formed as the bias circuit 60 and the PLL circuit 160 shown in FIG. 9 can be used as substitutes.

In FIG. 14, first data selector 230 through fourth data selector 236 on a first stage are formed. The first data selectors 230 and the second data selector 232 are formed on a first transmitting block while the third data selector 234 and the fourth data selector 236 are formed on a second transmitting block. The first data selector 230 and the third data selector 234 on the first stage perform as a first selector in a broad sense, and the second data selector 232 and the fourth data selector 236 on the first stage perform as a second selector in a broad sense. Data from the logic circuit 200 are divided into two routes. A normal signal is input to each terminal A of the first data selector 230 through the fourth data selector 236 while an inverted signal in which the normal signal is inverted by an inverter INV is input to each terminal B of the first data selector 230 through the fourth data selector 236.

Each of the first data selector 230 through the fourth data selector 236 on the first stage are formed by the circuit shown in FIG. 11, operating according to the truth table shown in FIG. 10, in a same manner of each of the first data selector 120 through the fourth data selector 126 on the first stage in FIG. 9. That is, when a select signal SEL is logic "1" (Front surface mounting: a first mode in a broad sense), the normal signal of the terminal A is selected. Further, when the select signal SEL is logic "0" (Back surface mounting: a second mode in a broad sense), the polarity of the differential signal pair is inverted from the polarity in the case of the front surface mounting. Therefore, the inverted signal of the terminal B is selected.

In FIG. 14, on the next row of the first stage in which the first data selector 230 through the fourth data selector 236 are formed, the first data selector 240 and the second data selector 242 (a third selector in a broad sense) on a second stage are formed. To the first data selector 240 on the second stage formed in the first transmitting block, outputs of the first data selector 230 and the second data selector 232 on the first stage are input. To the second data selector 242 on the second stage formed in the second transmitting block, outputs of the third data selector 234 and the fourth data selector 236 on the first stage are input.

Each of these data selectors, the first data selector 240 and the second data selector 242 on the second stage, has two input terminals (A and B), two output terminals (O and Q), and a select signal input terminal (S) in a same manner of each of the first data selector 130 and the second data selector 132 on the second stage shown in FIG. 9, so that a direction of the signal of the data selector is switched depending on the mounting structure. If the logic of the selector signal SEL is "1" (in the case of the front surface mounting), a signal from the input terminal A is output from the output terminal O, and a signal from the terminal B is output from the output terminal Q. On the contrary, if the logic of the select signal SEL is "0" (in the case of the back surface mounting), a signal from the input terminal B is output from the output terminal O, and a signal from the terminal A is output from the output terminal Q.

In this way, in the case of the front surface mounting, the normal signals D0 through D3 from the logic circuit 200 are output from the first data selector 240 and the second data selector 242 on the second stage. Among these, the data D2 becomes the clock signal CK in this embodiment. On the other hand, in the case of the back surface mounting, the normal signals D0 through D4 from the logic circuit 200, which are inverted to the inverted signals /D0 through /D3 by the inverter INV are output from the first data selector 240 and the second data selector 242 on the second stage. Among these, the inverted signal D3 becomes the clock signal CK.

On the next row of the first data selector 240 and the second data selector 242 on the second stage, first transmitting circuit section 250 through fourth transmitting circuit section 256 are formed. The first transmitting circuit section 250 and the second transmitting circuit section 252 are formed in the first transmitting block while the third transmitting circuit section 254 and the fourth transmitting circuit section 256 are formed in the second transmitting block.

Here, in the same manner shown FIG. 8, in FIG. 14, in the case of front surface mounting, the signal DP1 is output from the terminal 101 (the first terminal in a broad sense), the signal DM1 is output from the terminal 102 (the second terminal in a broad sense), the signal DP2 is output from the terminal 103 (the third terminal in a broad sense), the signal DM2 is output from the terminal 104 (the fourth terminal in a broad sense), the signal DP3 is output from the terminal 105 (the fifth terminal in a broad sense), the signal DM3 is output from the terminal 106 (the sixth terminal in a broad sense), the signal DP4 is output from the terminal 107 (the seventh terminal in a broad sense), and the signal DM4 is output from the terminal 108 (the eighth terminal in a broad sense). On the other hand, in the case of the back surface mounting, the signal DM2 is output from the terminal 101, the signal DP2 is output from the terminal 102, the signal DM1 is output from the terminal 103, the signal DP1 is output from the terminal 104, the signal DM4 is output from the terminal 105, the signal DP4 is output from the terminal 106, the signal DM3 is output from the terminal 107, and the signal DP3 is output from the terminal 108.

Here, by the switch mentioned above, in the case of the front surface mounting, the normal signal D0 is input to the first transmitting circuit 250, the normal signal D1 is input to the second transmitting circuit 252, the normal signal D2 is input to the third transmitting circuit 254, and the normal signal D3 is input to the fourth transmitting circuit 256. On the other hand, in the case of the back surface mounting, the inverted signal /D1 is input to the first transmitting circuit 250, the inverted signal /D0 is input to the second transmitting circuit 252, the inverted signal /D3 is input to the third transmitting circuit 254, and the inverted signal D2 is input to the fourth transmitting circuit 256.

At this time, D0 and /D0 are original signals to generate DP1 and DM1, D1 and /D1 are original signals to generate DP2 and DM2, D2 and /D2 are original signals to generate DP3 and DM3, and D3 and /D3 are original signals to generate DP4 and DM4. Therefore, as it is shown in FIG. 8, a proper signal is transmitted to each of the terminals 101 through 108 depending on the mounting structure.

Each of the first transmitting circuit section 250 through the fourth transmitting circuit section 256 includes a pre-driver and a transmitting driver as shown in FIG. 14. For example, a pre-driver 250-1 formed on the first transmitting circuit 250 outputs a positive signal D0POS and a negative signal D0NEG based on a signal (D0 or /D1) from the first data selector 240 on the second stage. A transmitting driver 250-2 formed on the first transmitting circuit 250 generates the signals DP1 and DM1 based on a signal from the pre-driver 250-1, an enable signal D0EN from the logic circuit 200, and a reference voltage VREF. Output D0COM of the transmitting driver 250-2 is a signal to feedback to an operational amplifier in the bias circuit 210 in order to control a common voltage at the transmitting circuit 250, and is not output to outside of the display driver 20. The second transmitting circuit section 252 and the third transmitting circuit section 256 also include pre-drivers 251-1 through 256-1, transmitting drivers 252 through 256-2, and transmit signals DP2 through DP4 and DM2 through DM4 based on outputs from the first second data selector 240 and the second data selector 242 on the second stage, enable signals D1EN through D3EN from the logic circuit 200, and the reference voltage VREF. The enable signals D0EN through D3EN are set at the timing to operate a transmitting circuit that generates a clock CK in the case of the front surface mounting or the back surface mounting prior to other transmitting circuits.

Modifications

As understood by those skilled in the art, various changes can be made with the present embodiment of the invention that has been described in detail without departing from the spirit and scope of the invention. All of such changes are to be regarded to be in the scope of the invention. For example, terms referred as broader or equivalent terms in the specification and drawings can be replaced with the broader or equivalent terms in any part of the specification and drawings.

The interface circuit related to the invention is not limited to the interface circuit in the liquid crystal driver IC described above. Further, the interface circuit of the invention is also applicable to USB, IEEE1394 or OTG.

As shown in FIGS. 6 through 8, according to the result of adopting the bump arrangement shown in FIG. 4, in each wiring pattern on the glass substrate 10A and the flexible printed circuit board FPC, signal lines of four differential signal pairs are arranged between power supply lines of a constant potential, or two VSS power supply lines in FIG. 6. The wiring pattern formed on the glass substrate 10A here can realize a single layer only. Therefore, the pattern cannot cross a different pattern and has to be a pattern arrangement according to the pad arrangement of the display driver 20. Further, a multilayer wiring such as a microstrip is impossible to form on the glass substrate 10A.

Signal amplitude of the differential signal input to the high speed serial interface circuit 50 of the embodiment is small and susceptible to noise from outside because of speeding up of serial transfer. However, as shown in FIG. 6, by arranging VSS power supply lines on both sides of four differential signal pairs (in a case of a double pad, two VSS line on each side), the differential signal pairs can be shielded by the VSS power supply lines on the both sides. As a result, besides prevention of EMI noise as noise from outside, prevention of noise due to a voltage cause by effect of shielding an electric filed, and prevention of noise due to an electric current cause by effect of shielding a magnetic field are realized.

What is claimed is:

1. An integrated circuit devices comprising:
   first through fourth terminals arranged in order, the first terminal and the fourth terminal being arranged in line symmetry with respect to a center axis of the first through fourth terminals, and the second terminal and the third terminal being arranged in line symmetry with respect to the center axis;
   a first receiving circuit coupled to the first and second terminals, the first receiving circuit receiving one of a first differential signal pair and a second differential signal pair;
   a second receiving circuit coupled to the third and fourth terminals, the second receiving circuit receiving the first differential signal pair when the first receiving circuit receives the second differential signal pair and the second differential signal pair when the first receiving circuit receives the first differential signal pair;
   a first selector selecting one of a first signal and a second signal obtained by inverting the first signal that are output from the first receiving circuit based on a select signal;
   a second selector selecting one of a third signal and a fourth signal obtained by inverting the third signal output from the second receiving circuit based on the select signal; and
   a third selector outputting each output of the first and second selectors by switching each output to a first output line and a second output line based on the select signal.

2. The integrated circuit device according to claim 1, wherein the first selector selects the first signal of the first receiving circuit and the second selector selects the third signal of the second receiving circuit, and the third selector outputs the first signal of the first receiving circuit to the first output line and the third signal of the second receiving circuit to the second output line in a first mode set by the select signal while the first selector selects the second signal of the first receiving circuit and the second selector selects the fourth signal of the second receiving circuit, and the third selector outputs the second signal of the first receiving circuit to the second output line and the fourth signal of the second receiving circuit to the first output line in a second mode set by the select signal.

3. The integrated circuit device according to claim 1, further comprising:
   an enable signal input terminal formed on each of the first and second receiving circuits;
   a fourth selector to input first and second enable signals that are different from each other to the enable signal input terminal of the first receiving circuit by switching the first and second enable signals based on the select signal; and
   a fifth selector to input the first enable signal and a third enable signal that is different from the first enable signal to the enable signal input terminal of the second receiving circuit by switching the first and third enable signals based on the select signal.

4. The integrated circuit device according to claim 1, wherein each of the first through fourth terminals is formed by a bump.

5. The integrated circuit device according to claim 1, further comprising:

a fifth through eighth terminals, the fifth terminal and the eighth terminal being arranged in line symmetry with respect to the center axis, and the sixth terminal and the seventh terminal being arranged in line symmetry with respect to the center axis, and the first and second terminals, the fifth through eighth terminals, and the third and the fourth terminals being arranged in this order; and two receiving blocks each including the first and second receiving circuits and the first through third selectors as a set, each of the two receiving blocks receives two different differential signal pairs.

6. The integrated circuit device according to claim 5, wherein two terminals coupled to one of the first and second receiving circuits among the first through eighth terminals receive a differential signal pair for a clock.

7. An integrated circuit device, comprising:
first through fourth terminals arranged in order, the first terminal and the fourth terminal being arranged in line symmetry with respect to a center axis of the first through fourth terminals, and the second terminal and the third terminal being arranged in line symmetry with respect to the center axis;
a first transmitting circuit coupled to the first and second terminals, the first transmitting circuit outputting one of a first differential signal pair and a second differential signal pair;
a second transmitting circuit coupled to the third and fourth terminals, the second transmitting circuit outputting the first differential signal pair when the first transmitting circuit outputs the second differential signal pair and the second differential signal pair when the first transmitting circuit outputs the first differential signal pair;
a first selector selecting one of a first signal and a second signal obtained by inverting the first signal based on a select signal;
a second selector selecting one of a third signal and a fourth signal obtained by inverting the third signal based on the select signal; and
a third selector outputting each output of the first and second selectors by switching each output to the first transmitting circuit and the second transmitting circuit based on the select signal.

8. The integrated circuit device according to claim 7, wherein the first selector selects the first signal and the second selector selects the third signal in a first mode set by the select signal, and the third selector outputs the first signal to the first transmitting circuit and the third signal to the second transmitting circuit while the first selector selects the second signal and the second selector selects the fourth signal in a second mode set by the select signal, and the third selector outputs the second signal to the second transmitting circuit and the fourth signal to the first transmitting circuit.

9. The integrated circuit device according to claim 7, wherein each of the first through fourth terminals is formed by a bump.

10. The integrated circuit device according to claim 7, further comprising:
fifth through eighth terminals, the fifth terminal and the eighth terminal being arranged in line symmetry with respect to the center axis, and the sixth terminal and the seventh terminal being arranged in line symmetry with respect to the center axis, and the first and second terminals, the fifth through eighth terminals, and the third and fourth terminals being arranged in this order; and
two transmitting blocks each including the first and second transmitting circuits and the first through third selectors as a set, each of the two transmitting blocks outputting two different differential signal pairs.

11. The integrated circuit device according to claim 10, wherein two terminals coupled to one of the first and second transmitting circuits among the first through eighth terminals output a differential signal pair for a clock.

12. The integrated circuit device according to claim 1, further comprising:
two of first input terminals which receive a first power supply potential, the two of the first input terminals being arranged in line symmetry with respect to the center axis; and
two of second input terminals which receive a second power supply potential different from the first power supply potential, the two of the second input terminals being arranged in line symmetry with respect to the center axis.

13. An electronic apparatus, comprising:
a substrate including a main circuit mounted on a front surface of the substrate; and
the integrated circuit device according to claim 1, mounted on the front surface of the substrate, in which the select signal is set at logic for a front surface mounting.

14. An electronic apparatus, comprising:
a substrate including a main circuit mounted on a back surface of the substrate; and
the integrated circuit device according to claim 1, mounted on the back surface of the substrate, in which the select signal is set at logic for a back surface mounting.

15. The electronic apparatus according to claim 13, wherein the substrate further includes a flexible printed circuit board that is coupled to a signal pattern formed on a surface on which the integrated circuit device is mounted.

* * * * *